United States Patent [19]

Johnson

[11] 4,002,912
[45] Jan. 11, 1977

[54] ELECTROSTATIC LENS TO FOCUS AN ION BEAM TO UNIFORM DENSITY

[75] Inventor: Cleland H. Johnson, Oak Ridge, Tenn.

[73] Assignee: The United States of America as represented by the United States Energy Research and Development Administration, Washington, D.C.

[22] Filed: Dec. 30, 1975

[21] Appl. No.: 645,169

[52] U.S. Cl. .................... 250/396 R; 250/307; 313/361; 328/228
[51] Int. Cl.² .......................................... H01J 37/12
[58] Field of Search .......... 250/396, 397, 306, 307; 328/228, 229; 313/356, 361

[56] References Cited

UNITED STATES PATENTS

| 2,866,902 | 12/1958 | Nygard | 250/396 |
| 2,952,791 | 9/1960 | Wideroe | 250/396 X |
| 3,100,260 | 8/1963 | Wilska | 250/396 |
| 3,621,327 | 11/1971 | Hashmi | 250/396 X |
| 3,676,693 | 7/1972 | Guernet | 328/229 X |
| 3,937,958 | 2/1976 | Rusch et al. | 250/307 |

Primary Examiner—Eugene R. LaRoche
Attorney, Agent, or Firm—Dean E. Carlson; David S. Zachry; Louis M. Deckelman

[57] ABSTRACT

A focusing lens for an ion beam having a gaussian or similar density profile is provided. The lens is constructed to provide an inner zero electrostatic field, and an outer electrostatic field such that ions entering this outer field are deflected by an amount that is a function of their distance from the edge of the inner field. The result is a beam that focuses to a uniform density in a manner analogous to that of an optical ring lens. In one embodiment, a conically-shaped network of fine wires is enclosed within a cylindrical anode. The wire net together with the anode produces a voltage field that re-directs the outer particles of the beam while the axial particles pass undeflected through a zero field inside the wire net. The result is a focused beam having a uniform intensity over a given target area and at a given distance from the lens.

7 Claims, 5 Drawing Figures

ELECTROSTATIC LENS TO FOCUS AN ION BEAM TO UNIFORM DENSITY

BACKGROUND OF THE INVENTION

This invention was made in the course of, or under, a contract with the Energy Research and Development Administration.

Ion-induced radiation damage studies are often used to simulate neutron radiation damage such as described in the application of Everett E. Bloom et al., Ser. No. 596,546(70), filed July 16, 1975, and having a common assignee with the present application. These studies are among the most important of present charged-particle accelerator applications.

A common requirement of many of the irradiation studies concerns the fact that specimens are generally examined over a very small area, and often several specimens are irradiated simultaneously. It is therefore convenient to work with a beam having a very uniform beam density profile. Instead of having a uniform density, however, the typical beam from an ion accelerator has a more gaussian density profile; i.e., intense along the axis and trailing off gradually to zero intensity at the beam boundaries.

To achieve uniform impingment density on the target (specimen), the ions can be focused to a small spot and the beam rastered over the entire target array. Unfortunately, such a technique introduces an undesirable time dependence. An allowed procedure, but an inefficient one, is to place the target out so far along the axis as to accept only the central part of the divergent beam.

Accordingly, a need exists to provide a special focusing lens having as its primary object to concentrate the flux of a gaussian or nearly gaussian ion beam to a nearly uniform distribution onto a target. The present invention was conceived to meet this need in a manner to be described hereinbelow.

SUMMARY OF THE INVENTION

It is the object of the present invention to provide means to focus a beam of ions that emanate with axial symmetry and gaussian or similar divergence from a small point source to a uniform intensity over a given target area.

The above object is accomplished by the present invention by providing a two-field electrostatic lens as follows: a first, field region is created and which is a field-free central region (ions incident at a radius $r<r_o$) and a second field region is created and is tailored such that ions incident at a radius $r>r_o$ are diverted toward the central axis by an amount that is proportional to their distance from the edge of the zero field, resulting in a beam that focuses to a uniform density at a given distance from the lens.

This invention is realized herein as a conical network of fine wires enclosed within a cylindrical anode. The wire net together with the anode produces a voltage field therebetween that re-directs the boundary particles of an input ion beam while the central particles of the input ion beam pass undeflected through the zero field region inside the wire net. For a gaussian or similar beam, the result is a focused beam having a uniform intensity over a given target area.

DESCRIPTION OF THE PREFERRED EMBODIMENT

Figure 1:
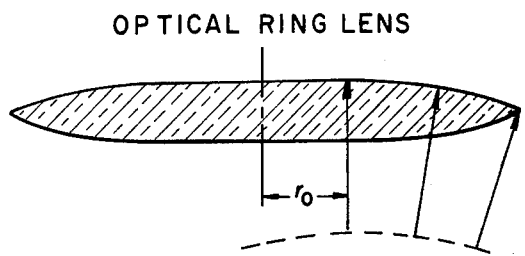
FIG. 1 is a sectional view of an analogous optical ring lens for focusing a light beam.

The focusing lens of the present invention can be understood by first referring briefly to what would be its optical equivalent, as shown in FIG. 1. I call this lens a ring lens for reasons that will be apparent. Its inner surfaces are parallel planes and its outer radii of curvature meet the planes tangentially at the radius $r_o$. Thus, it is really two different lenses depending on whether a ray is incident on the lens at $r<r_o$, or at $r>r_o$.

Figure 2:
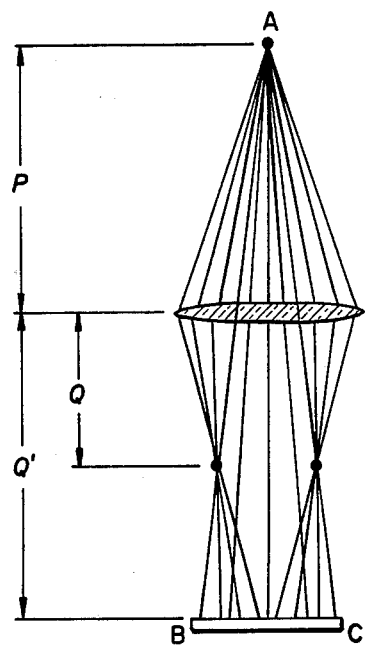
FIG. 2 is a schematic illustration of a light beam ray distribution from a point source utilizing the lens of FIG. 1.

The unusual optical lens of FIG. 1, could it actually be made, would produce a light beam ray distribution as illustrated in FIG. 2. Beam rays from a point source A having a radial distribution that is gaussian or similar that strike the plane surfaces of the ring lens are undeflected and thus constitute an inner undeflected cone (rays within A-B and A-C). The rays incident on the ring lens at $r>r_o$ focus to an image ring at the distance Q and then diverge to the target. The net result is a nearly uniform distribution of rays over the target surfaces as shown.

Figure 3:
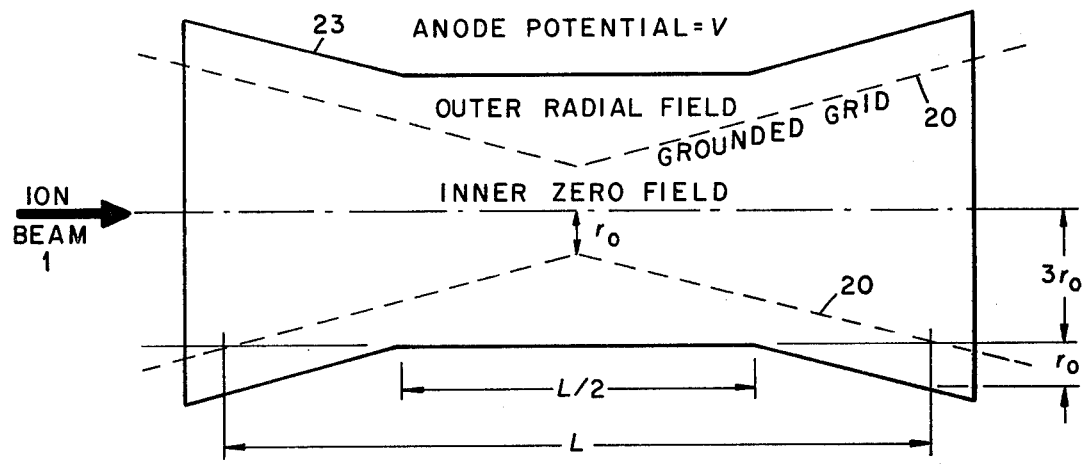
FIG. 3 is a schematic view of the electrostatic ion focusing lens of the present invention.

The electrostatic lens of the present invention functions in an analogous way. With reference now to FIG. 3, a cylindrical anode 23 having a potential V and an inner double conical grid 20 at ground potential are shown. Within $r_o$, a zero (field free) region is formed while an outer radial field simultaneously exists between the anode 23 and the wire grid 20 ($r>r_o$). Like the optical ring lens of FIGS. 1 and 2, the electrostatic lens of FIG. 3 has two concentric lens regions; in this case they are separated by a grid conductor that must be highly transparent to the incoming ion beam. The dimensions $r_o$, $3r_o$, and L shown in FIG. 3 are discussed in more detail in a theoretical paper of mine published in Nuclear Instruments and Methods, Vol. 127, pp. 163–171, 1975, which is incorporated by reference thereto.

Figure 4:
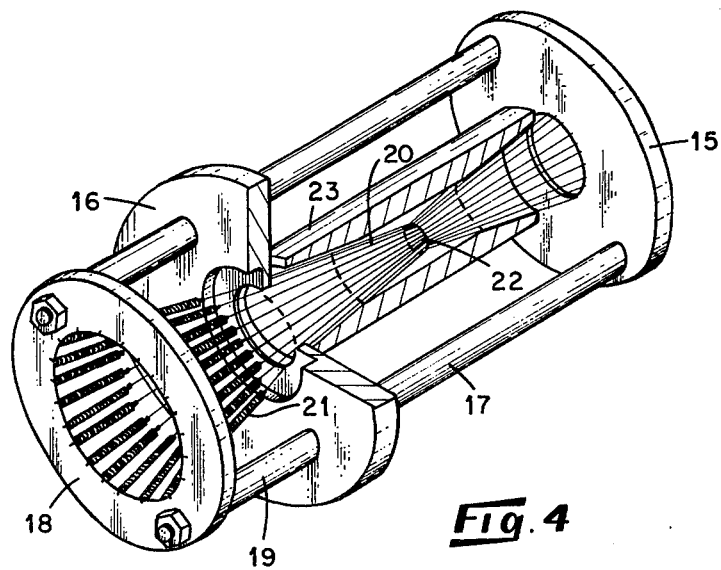
FIG. 4 is an isometric structural view of the electrostatic ion focusing lens of the present invention.

One embodiment of a lens assembly meeting desired focusing and transparency requirements of the present invention and discussed in the above-mentioned paper is shown in FIG. 4. It was built for $r_o = 0.33$ cm and $L = 8$ cm. Two grid support rings 15 and 16 are separated by two spacer rods 17, and a second pair of spacer rods 19 separate a spring support ring 18 and the ring 16. A double conical grid 20 represents a compromise between conflicting demands of uniformity of the radial field, transparency to the incident ion beam, and mechanical stability and simplicity. The grid 20 has twenty-four equally spaced 0.005-cm diameter wires (either molybdenum or tungsten) attached to the support ring 15, threaded through a grid ring 22 and through the support ring 16 where they are fastened to a set of springs 21 that are, in turn, fastened to the spring support ring 18. The wires 20 are under tension so as to remain stable when heated by ion bombardment.

An insulated anode 23 surrounding the grid 20 is split lengthwise for installation after the grid is constructed, and is connected electrically to receive a high voltage (V) from a source, not shown. It can be seen from FIGS. 3 and 4 that the interior of the anode 23 is flared outwardly at each end thereof to make the average field experienced by the ions at any given radius outside of $r_o$ nearly independent of that radius. The other components of FIG. 4, including the grid 20, are at ground potential. The entire lens assembly is mounted in a vacuum housing, not shown, having an electrical feedthrough for the anode voltage and means for coupling a source of high energy ions for entrance through the vacuum housing and then through the lens of FIG. 4.

Figure 5:
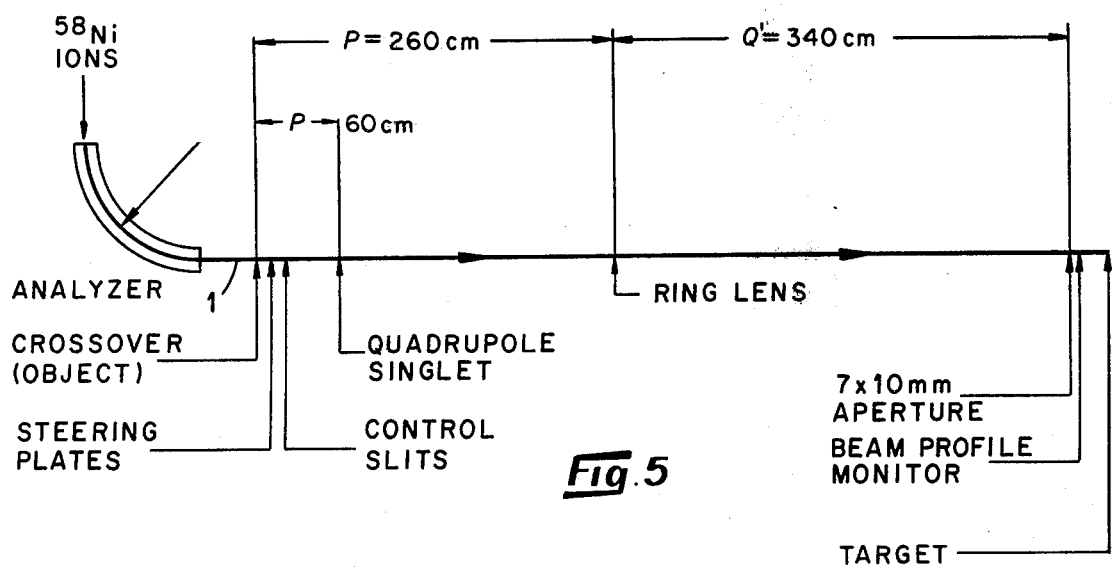
FIG. 5 is a schematic illustration of one use of the lens of the present invention for radiation damage studies.

FIG. 5 shows a typical beam path from a 5.5-MV electrostatic ion accelerator with the lens of FIG. 4 installed in the beam line 1 thereof. Components to the left of the lens in FIG. 5 are all associated with the incident beam into the lens, the lens is near the middle, and a rectangular aperture and beam profile monitor are near the target to the right.

Components associated with the incident beam are the analyzer and slits, the steering plates, and the quadrupole singlet. The analyzer is a 90° double-focusing magnet which, together with the slits, serves to analyze and control the beam from an accelerator, not shown. Since the unanalyzed beam has small divergence, the crossover formed near the focal points of the magnet is small, about 1 mm diameter. This crossover is an ion object which is essentially fixed in space, so the object-target axis is well-defined. It is important that the other components not disturb this axis. Therefore, the electrostatic steering plates, which are needed to correct for angular deviations of the beam from the axis, are placed near the object to avoid formation of an off-axis virtual object. Also, the quadrupole for symmetrization of the beam 1, when needed, is placed near the object to minimize the axial extent of the virtual object for the ring lens.

The electrostatic lens of the present invention when installed in the beam line of the 5.5-MV electrostatic accelerator has been operated without failure for a few hundred hours with incident 1 to 5 particle-$\mu$amp beams of 4-MeV doubly-charged $^{58}$Ni ions, and it has been determined that the lens is a reliable device that transforms a gaussian or similarly divergent and symmetric ion beam into a nearly uniform distribution on a target. For example, in one test, 30% of a 4-MeV $^{58}$Ni ion beam was focused onto a 7 mm × 10 mm rectangular target array with a uniformity of about ± 15%. This intensity represents an increase of 2 to 3 times that which was previously achievable.

This invention has been described by way of illustration rather than by limitation and it should be apparent that it is equally applicable in fields other than those described.

What is claimed is:

1. An electrostatic focusing lens for focusing a point source ion beam of gaussian cross sectional distribution to a uniform cross sectional distribution at a given distance from the lens, comprising a grounded inner semi-transparent grid which is axi-symmetric with said ion beam, said grid having a minimum axial aperture that matches a central cone portion of said beam, said grid being a double conical grid including a plurality of equally spaced metallic wires with a high melting point and a low expansion coefficient and a grid ring encompassing said grid wires and defining said axial aperture and provided with a desired radius with said grid wires being threaded therethrough to thus form said double conical grid, said lens further including a first grid support ring, a second support ring, a first pair of spacer rods mounted between and to said first and second rings for providing a desired spacing therebetween, a third spring support ring, a second pair of spacer rods mounted between and to said second ring and to said third ring, and a plurality of springs equal in number to said grid wires, said grid wires being attached at first respective ends thereof to the inner edge of said first support ring with the other respective ends of said grid wires extending through said second support ring and fastened to first respective ends of said springs and the other respective ends of said springs being affixed to the inner edge of said third spring support ring, and an insulated outer anode encompassing and spaced from said double conical grid within said desired spacing between said first and second support rings, said first, second and third support rings as well as said grid being at ground potential, said anode adapted to be connected to a voltage source, said anode shaped such that said voltage applied thereto provides an electrostatic field between said anode and said grid, said grid, anode and support rings adapted to be mounted within an evacuated housing, whereby a portion of the ions from said ion beam that pass through the inside of said grid are undeflected by the zero field that exists within said grid, and the remaining portion of the ions from said ion beam that are outside of said central cone defined by said grid are deflected by said electrostatic field toward the axis of said grid an amount proportional to their minimum radial distance from said central cone such that the deflected and undeflected portions of said ion beam merge to produce said uniform distribution at said given distance from said lens.

2. The lens set forth in claim 1, wherein said grid wires are molybdenum.

3. The lens set forth in claim 1, wherein said anode in the central portion thereof has an inner radius three times the radius of said grid ring with the respective inner end portions of said anode flaring outwardly.

4. The lens set forth in claim 3, wherein said central portion of said anode constitutes about half of the length thereof and is provided with a constant radius in said half, and wherein the respective outer extremities of said respective inner flared-out portions of said anode have a respective inner radium about 4 times the radius of said grid ring.

5. The lens set forth in claim 1, wherein the number of said grid wires and attached springs is 24.

6. The lens set forth in claim 5, wherein said radius of said grid ring is equal to 0.33 cm, and the length of said anode is about 8 cm.

7. The lens set forth in claim 6, wherein the diameter of each of said grid wires is 0.005 cm.

* * * * *